United States Patent
Wu et al.

(10) Patent No.: US 7,939,950 B2
(45) Date of Patent: May 10, 2011

(54) CHIP PACKAGE STRUCTURE

(75) Inventors: Cheng-Ting Wu, Hsinchu (TW);
I-Cheng Lu, Hsinchu (TW); Yu-Cheng Chang, Hsinchu (TW); Tsu-Ting Wang, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 254 days.

(21) Appl. No.: 12/269,112

(22) Filed: Nov. 12, 2008

(65) Prior Publication Data

US 2009/0236755 A1 Sep. 24, 2009

(30) Foreign Application Priority Data

Mar. 19, 2008 (TW) .............................. 97109741 A (51) Int. Cl.
*H01L 23/34* (2006.01)
*H01L 23/48* (2006.01)
(52) U.S. Cl. .. 257/784; 257/686; 257/723; 257/E23.169
(58) Field of Classification Search .................. 257/686, 257/777, 784, E23.169
See application file for complete search history.

(56) References Cited

U.S. PATENT DOCUMENTS

| | | | |
|---|---|---|---|
| 6,013,948 A * | 1/2000 | Akram et al. | 257/698 |
| 6,049,129 A * | 4/2000 | Yew et al. | 257/737 |
| 6,271,056 B1 * | 8/2001 | Farnworth et al. | 438/106 |
| 6,303,997 B1 * | 10/2001 | Lee | 257/778 |
| 6,686,656 B1 * | 2/2004 | Koh et al. | 257/686 |
| 7,190,061 B2 * | 3/2007 | Lee | 257/686 |
| 2005/0167850 A1 * | 8/2005 | Moden | 257/778 |
| 2005/0205979 A1 * | 9/2005 | Shin et al. | 257/678 |
| 2006/0220209 A1 * | 10/2006 | Karnezos et al. | 257/686 |
| 2007/0045803 A1 * | 3/2007 | Ye et al. | 257/686 |

* cited by examiner

*Primary Examiner* — Nitin Parekh
(74) *Attorney, Agent, or Firm* — Muncy, Geissler, Olds & Lowe, PLLC (57) ABSTRACT

A chip package structure is provided. The chip package structure comprises a first substrate, a second substrate and a plurality of chips. Therein, one of the chips is connected to the first substrate and electrically connected to the first substrate through a via hole of the first substrate. Thereby, the second substrate does not need the via hole for electrical connection of chips and thus, the surface thereof is adapted to remain intact to allow for the disposition of conductive balls throughout the surface.

20 Claims, 8 Drawing Sheets

CHIP PACKAGE STRUCTURE

This application claims priority to Taiwan Patent Application No. 097109741 filed on Mar. 19, 2008, the disclosures of which are incorporated herein by reference in their entirety.

CROSS-REFERENCES TO RELATED APPLICATIONS

Not applicable.

BACKGROUND OF THE INVENTION

1. Field of the Invention

The present invention relates to a chip package structure, and more particularly, relates to a chip package structure adopting package on package (PoP) technology.

2. Descriptions of the Related Art

Because electronic products have become miniaturized, the internal space in such electronic products has become increasingly smaller. Hence, almost all manufacturers are directing efforts into shrinking the dimensions of the internal elements in the electronic products. The arrangement of chips in smaller space has also become important with regards to integration. According to the package on package (PoP) technology, a plurality of chips are stacked on each other in a single chip package structure, so that a plurality of chips are packaged with the area of the package remaining unchanged. With the PoP technology, the area occupied by the plurality of chips is reduced remarkably only at a cost of a slightly increased thickness of the chip package structure. For this reason, the PoP technology has gradually found wide application in various electronic products.

Figure 1:
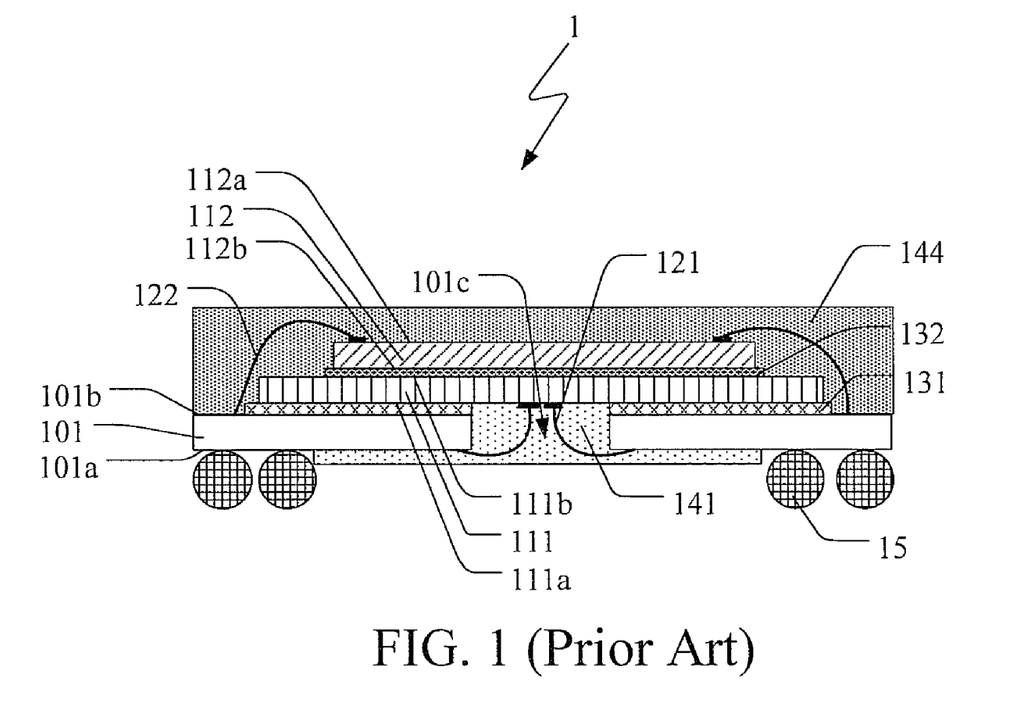
FIG. 1 is a schematic cross-sectional view of the conventional chip package structure adopting the PoP technology.

However, packaging a plurality of chips into a single chip package structure leads to a significant increase of the number of pins in the single chip package structure for connection with other electronic devices, such as printed circuit boards (PCBs). Therefore, in a conventional chip package structure 1 as shown in FIG. 1, a Ball Grid Array (BGA) packaging technology for disposing a plurality of conductive balls 15 on a surface of a substrate 101 is adopted together as a means to increase the number of pins (i.e., conductive balls) for electrical connection.

The conventional chip package structure 1 comprises a single substrate 101, a first chip 111, a second chip 112, a plurality of conductive balls 15, a first wire portion 121, a second wire portion 122, a first adhesive layer 131, a second adhesive layer 132, a plastic layer 141 and an outer plastic layer 144. A first bonding surface 111a of the first chip 111 is partially adhered to a second surface 101b of the substrate 101 by means of the first adhesive layer 131, and is electrically connected to a first surface 101a of the substrate 101 by means of the first wire portion 121 which passes through a via hole 101c of the substrate 101. The plastic layer 141 is formed in the via hole 101c and partially covers the surface 101a of the substrate 101 to protect the first wire portion 121 and to facilitate the packaging process. A second opposite surface 112b of the second chip 112 is adhered to a first opposite surface 111b of the first chip by means of the second adhesive layer 132. A second bonding surface 112a of the second chip 112 is electrically connected to the second surface 101b of the substrate 101 via the second wire portion 122. Finally, the structure is covered by the outer plastic layer 144.

The plurality of conductive balls 15 must be kept off the via hole 101c and the plastic layer 141, so they can only be disposed on the remaining portions of the first surface 101a of the substrate 101. To package a plurality of chips, the substrate 101 is formed with the via hole 101c, so that the first wire portion 121 passes through the via hole 101 to electrically connect the first chip 111 to the substrate 101 without interfering with the second wire portion 122 for electrically connecting the second chip 112 to the substrate 101. Hence, it is impossible for the plurality of conductive balls 15 to be disposed throughout the first surface 101a of the substrate 101, which decreases the allowed number of conductive balls 15.

In summary, the PoP technology used at present for the BGA package fails to meet the demand of increasing the number of pins by effectively increasing the number of conductive balls. In view of this, it is highly desirable in the art to provide a chip package structure capable of packaging a plurality of chips and remarkably increasing the number of conductive balls.

SUMMARY OF THE INVENTION

One objective of this invention is to provide a chip package structure comprising a plurality of chips. The chip package structure packages the plurality of chips at the same time and eliminates the need of a via hole on a surface of a substrate where a plurality of conductive balls are disposed to meet the demand of increasing the number of pins of the chip package structure. In addition, more chips may be stacked while the occupied area remains unchanged.

The chip package structure of this invention comprises a first substrate, a second substrate and a plurality of chips. The first substrate and the second substrate are used to package the plurality of chips with the PoP technology, wherein one of the plurality of chips is connected to the first substrate and electrically connected to the first substrate through a via hole of the first substrate, while the other chips are connected to other positions and electrically connected to the first substrate and the second substrate. Because the via hole for electrically connecting the chips is eliminated in the second substrate, the surface of the second substrate remains intact and the conductive balls are allowed to be distributed throughout the entire surface thereof without a via hole as occurred in the prior art solutions.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

The basic concept of the chip package structure of this invention is that by using two substrates, a plurality of chips are packaged with the PoP technology in such a way that a via hole, which is conventionally used for electrically connecting the chips, is eliminated in one of the two substrates. As a result, one substrate remains intact while the conductive balls are allowed to be distributed throughout the entire surface thereof without the via hole. Accordingly, when the Ball Grid Array (BGA) packaging technology is adopted, the number of conductive balls may be increased significantly to meet the demand for increasing the number of pins in the chip package structure without changing the occupied area.

Figure 2:
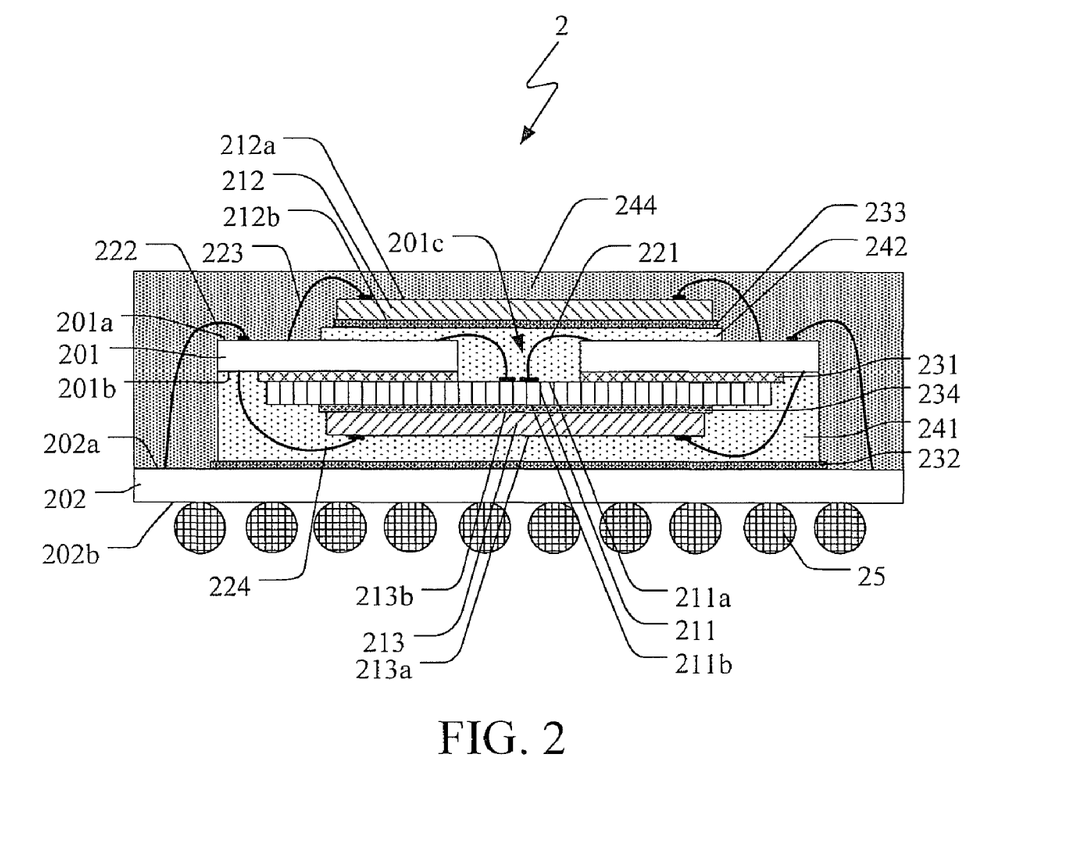
FIG. 2 is a schematic cross-sectional view of the first embodiment of a chip package structure according to this invention.

As shown in FIG. 2, a chip package structure 2 of this invention generally at least comprises a first substrate 201, a second substrate 202, a plurality of chips, a first wire portion 221, a second wire portion 222, a third wire portion 223, a fourth wire portion 224, a first adhesive layer 231, a second adhesive layer 232, a third adhesive layer 233, a fourth adhesive layer 234, a first plastic layer 241 and a second plastic layer 242. The plurality of chips includes a first chip 211, a second chip 212, and a third chip 213. The first substrate 201 has a first surface 201a, a second surface 201b and a via hole 201c. The second substrate 202 has a third surface 202a, a fourth surface 202b and a plurality of conductive balls 25. The first chip 211 has a first bonding surface 211a and a first opposite surface 211b. The second chip 212 has a second bonding surface 212a and a second opposite surface 212b. The third chip 213 has a third bonding surface 213a and a third opposite surface 213b.

Generally speaking, the first chip 211 covers the via hole 201c of the first substrate 201. The wires pass through the via hole 201c and electrically connected to the first surface 201a of the first substrate 201 via pads. Also, the first chip 211 is connected to the second surface 201b of the first substrate 201 via an adhesive layer. The third surface 202a of the second substrate 202 is opposite to and connects with one of the first surface 201a and the second surface 201b of the first substrate 201. The other of the first surface 201a and the second surface 201b is in turn electrically connected to the third surface 202a via wires and pads. Hence, the conductive balls 25 can be distributed throughout the fourth surface 202b of the second substrate 202. As a result, the number of pins is increased. However, the number of conductive balls 15 in the conventional chip package structure 1 has to be decreased due to the vial hole 101c of the substrate 101 (as shown in FIG. 1). Finally, all the devices above the second substrate 202 are covered by an outer plastic layer 244 to protect the whole chip package structure 2.

The first embodiment of this invention is just as shown in FIG. 2. In the chip package structure 2 of this invention, the second surface 201b of the first substrate 201 is opposite the third surface 202a of the second substrate 202. The first bonding surface 211a of the first chip 211 is connected to the second surface 201b of the first substrate 201 via the first adhesive layer 231, and covers the via hole 201c of the first substrate 201. Additionally, the first wire portion 221 passes through the via hole 201c to electrically connect the first bonding surface 211a of the first chip 211 to the first surface 201a of the first substrate 201.

The first plastic layer 241 covers the first chip 211, and is disposed between the second adhesive layer 232 on the third surface 202a of the second substrate 202 and the first substrate 201. The first plastic layer 241 is adapted to connect the second adhesive layer 232 and the second surface 201b of the first substrate 201. In other words, the first substrate 201 and the second substrate 202 are connected and fixed together via the first plastic layer 241 and the second adhesive layer 232.

The second plastic layer 242 is filled and disposed in the via hole 201c and partially covers the first surface 201a of the first substrate 201. In addition to the second plastic layer 242, the third adhesive layer 233 and the second chip 212 are also disposed above the first substrate 201 in sequence.

More specifically, the third adhesive layer 233 is adapted to adhere the second plastic layer 242 above the first substrate 201 to the second opposite surface 212b of the second chip 212. On the other hand, the second plastic layer 242 is disposed at least between the third adhesive layer 233 and the first substrate 201 and thus is adapted to connect the third adhesive layer 233 and the first surface 201a. By connecting the second opposite surface 212b of the second chip 212 and the first surface 201a of the first substrate 201 via the third adhesive layer 233 and the second plastic layer 242, the second chip 212 and the first substrate 201 are connected together. Additionally, the second bonding surface 212a of the second chip 212 is electrically connected with the first surface 201a of the first substrate 201 via the third wire portion 223.

The third opposite surface 213b of the third chip 213 and the first opposite surface 211b of the first chip 211 are connected to each other via the fourth adhesive layer 234. On the other hand, the third bonding surface 213a of the third chip 213 adjoins and is covered by the first plastic layer 241. Additionally, the third bonding surface 213a of the third chip 213 is further electrically connected to the second surface 201b of the first substrate 201 via the fourth wire portion 224 of the chip package structure 2. In this embodiment, the chip package structure 2 comprises the third chip 213. However, in other embodiments, the chip package structure 2 may not comprise the third chip 213, or may even comprise chips arranged in other manners.

The first substrate 201 is not only connected and adhered to the second substrate 202 via the first plastic layer 241 and the second adhesive layer 232, but the first surface 201a of the first substrate 201 is also electrically connected to the third surface 202a of the second substrate 202 via the second wire portion 222. Thus, the structures (exclusive of the wires) above the third surface 202a of the second substrate 202 include, from top to bottom, the second chip 212, the third adhesive layer 233, the second plastic layer 242, the first substrate 201, the first adhesive layer 231, the first chip 211, the fourth adhesive layer 234, the third chip 213, the first plastic layer 241, and the second adhesive layer 232, in which the first plastic layer 241 is disposed under the first substrate 201, the first adhesive layer 231, the first chip 211, the fourth adhesive layer 234 and the third chip 213 but above the second adhesive layer 232. Finally, the structures above the third surface 202a of the second substrate 202 is covered by the outer plastic layer 244 to avoid exposure of the wires, chips and substrates, thus forming a complete package.

The plurality of conductive balls 25 is disposed underneath the fourth surface 202b of the second substrate 202. The first chip 211 is electrically connected to the corresponding conductive balls 25 via the first wire portion 221, the first substrate 201, the second wire portion 222 and the second substrate 202. Likewise, the second chip 212 is electrically connected to corresponding conductive balls 25 via the third wire portion 223, the first substrate 201, the second wire portion 222 and the second substrate 202. Similarly, the third chip 213 is electrically connected to the corresponding conductive balls 25 via the fourth wire portion 224, the first substrate 201, the second wire portion 222 and the second substrate 202.

Figure 3:
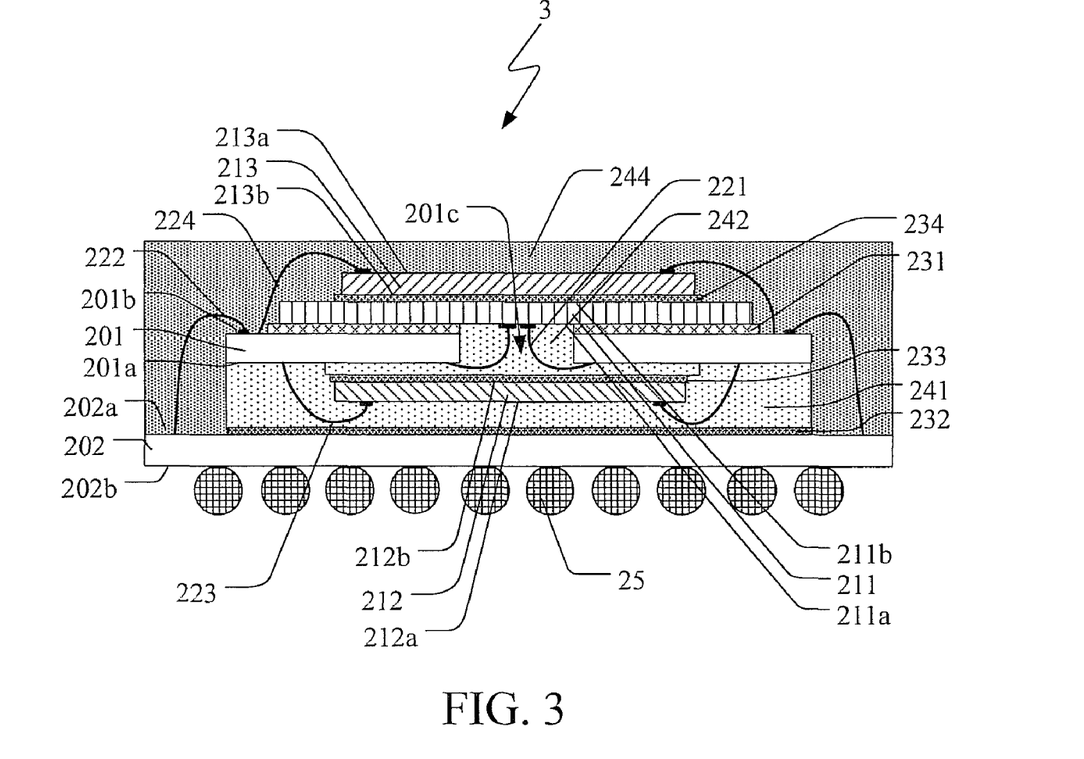
FIG. 3 is a schematic cross-sectional view of the second embodiment of the chip package structure according to this invention.

The second embodiment of this invention is depicted in FIG. 3. A chip package structure 3 of this embodiment consists of the same elements as those of the chip package structure 2 of the first embodiment, except that the relative positions of some elements are reversed from those of the first embodiment in the vertical direction. Except the wires, the third chip 213, the fourth adhesive layer 234, the first chip 211, the first adhesive layer 231, the first substrate 201, the second plastic layer 242, the third adhesive layer 233 and the second chip 212 of this embodiment are arranged in a reversed order from that of the first embodiment.

More specifically, in this embodiment, the third surface 202a of the second substrate 202 of the chip package structure 3 is opposite the first surface 201a of the first substrate 201 (instead of the second surface 201b of the first substrate 201), and the second surface 201b (instead of the first surface 201a) is electrically connected to the third surface 202a via the second wire portion 222.

In other words, positions of the first chip 211, the second chip 212, the third chip 213, the first wire portion 221, the third wire portion 223, the fourth wire portion 224, the first adhesive layer 231, the third adhesive layer 233, the fourth adhesive layer 234 and the second plastic layer 242 relative to the first substrate 201 are all in the same positions as those of the first embodiment. Furthermore, the plurality of conductive balls 25 is also disposed on the fourth surface 202b of the second substrate.

Compared to the chip package structure of the first embodiment, the chip package structure 3 of the second embodiment is unique in that elements connected to the first substrate 201 are arranged in a reversed order from that of the second substrate 202 and are connected to the second substrate 202. Hence, the second wire portion 222 is adapted to electrically connect the top surface (i.e., the second surface 201b in this embodiment) of the first substrate 201 and the second substrate 202. Similarly, the first plastic layer 241 is also disposed between the first substrate 201 and the second substrate 202, and the second adhesive layer 232 is adapted to adhere the first plastic layer 241 to the third surface 202a of the second substrate 202. However, the first plastic layer 241 covers the second chip 212, and the second adhesive layer 232 is adapted to connect the first surface 201a of the first substrate 201 and the third surface 202a of the second substrate 202 together (instead of connecting the second surface 201b and the third surface 202a together).

Other structures of this embodiment are identical to the first embodiment and thus, will not be described again herein. As thus, the structures (exclusive of the wires) in the chip package structure 3 of this embodiment include, from top to bottom, the outer plastic layer 244, the third chip 213, the fourth adhesive layer 234, the first chip 211, the first adhesive layer 231, the first substrate 201, the second plastic layer 242, the third adhesive layer 233, the second chip 212, the first plastic layer 241, the second adhesive layer 232 and the second substrate 202.

Figure 4:
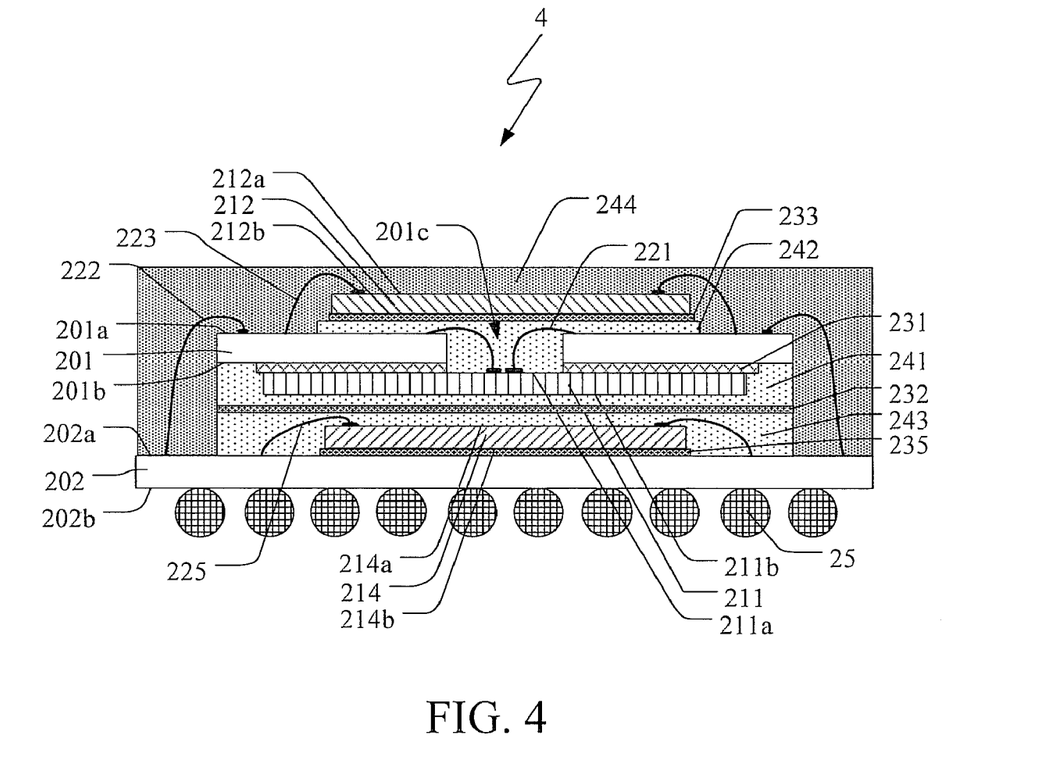
FIG. 4 is a schematic cross-sectional view of the third embodiment of the chip package structure according to this invention.

The third embodiment of this invention is depicted in FIG. 4. In this embodiment, a chip package structure 4 comprises at least a first substrate 201, a second substrate 202, a plurality of chips, a first wire portion 221, a second wire portion 222, a third wire portion 223, a fifth wire portion 225, a first adhesive layer 231, a second adhesive layer 232, a third adhesive layer 233, a fifth adhesive layer 235, a first plastic layer 241, a second plastic layer 242, a third plastic layer 243 and an outer plastic layer 244. The plurality of chips comprises a first chip 211, a second chip 212 and a fourth chip 214. The first substrate 201 has a first surface 201a, a second surface 201b and a via hole 201c. The second substrate 202 comprises a third surface 202a, a fourth surface 202b and a plurality of conductive balls 25. The first chip 211 comprises a first bonding surface 211a and a first opposite surface 211b. The second chip 212 has a second bonding surface 212a and a second opposite surface 212b. The fourth chip 214 has a fourth bonding surface 214a and a fourth opposite surface 214b.

That is, the chip package structure 4 is similar to the chip package structure 2 of the first embodiment, but does not include the third chip 213, the fourth adhesive layer 234 for adhering the third chip 213 to the first substrate 201, and the fourth wire portion 224 for electrically connecting the third chip 213 to the first substrate 201 in the chip package structure 2 of the first embodiment. Also, as compared to the chip package structure 2 of the first embodiment, the chip package structure 4 of the third embodiment further comprises the fourth chip 214, the fifth wire portion 225, the fifth adhesive layer 235 and the third plastic layer 243.

Here, the relative positions among the first substrate 201, the first chip 211, the second chip 212, the first wire portion 221, the second wire portion 222, the third wire portion 223, the first adhesive layer 231, the third adhesive layer 233, and the second plastic layer 242 are just the same as those of the chip package structure 2 of the first embodiment and thus, will not be described again herein.

The fourth opposite surface 214b of the fourth chip 214 and the third surface 202a of the second substrate 202 are connected to each other via the fifth adhesive layer 235. Furthermore, the fourth bonding surface 214a of the fourth chip 214 is further electrically connected to the third surface 202a of the second substrate 202 via the fifth wire portion 225, so that the fourth chip 214 is electrically connected, via the fifth wire portion 225 and the second substrate 202, to a plurality of corresponding conductive balls 25 disposed on the fourth surface 202b of the second substrate 202.

On the other hand, the fourth bonding surface 214a of the fourth chip 214 adjoins the third plastic layer 243. The third plastic layer 243 is adapted to cover the fourth chip 214, the fifth adhesive layer 235 and the fifth wire portion 225. The second adhesive layer 232 is disposed above the third plastic layer 243, i.e., the third plastic layer 243 is disposed between the second adhesive layer 232 and the second substrate 202 and connects the second adhesive layer 232 and the third surface 202a of the second substrate 202.

In the chip package structure 4 of the third embodiment, via the second adhesive layer 232, the structure formed by the first substrate 201, the first chip 211, the second chip 212, the first wire portion 221, the third wire portion 223, the first adhesive layer 231, the third adhesive layer 233 and the second plastic layer 242 similar to those of the first embodiment can be connected to the third plastic layer 243.

Similar to the first embodiment, the second surface 201b of the first substrate 201 is opposite to and connected to the third surface 202a of the second substrate 202, and the first surface 201a of the first substrate 201 is electrically connected to the third surface 202a of the second substrate 202 via the second wire portion 222. As thus, the structures (exclusive of the wires) above the third surface 202a of the second substrate 202 include, from top to bottom, the second chip 212, the third adhesive layer 233, the second plastic layer 242, the first substrate 201, the first adhesive layer 231, the first chip 211, the first plastic layer 241, the second adhesive layer 232, the third plastic layer 243, the fourth chip 214 and the fifth adhesive layer 235. The first plastic layer 241 is disposed under the first substrate 201, the first adhesive layer 231, the first chip 211, but above the second adhesive layer 232. The third plastic layer 243 is disposed under the second adhesive layer 232 but above the fourth chip 214, the fifth adhesive layer 235 and the second substrate 202. Finally, the structures above the third surface 202a of the second substrate 202 is covered by the outer plastic layer 244 to prevent the exposure of the wires, chips and substrates, thus forming a complete package.

Figure 5:
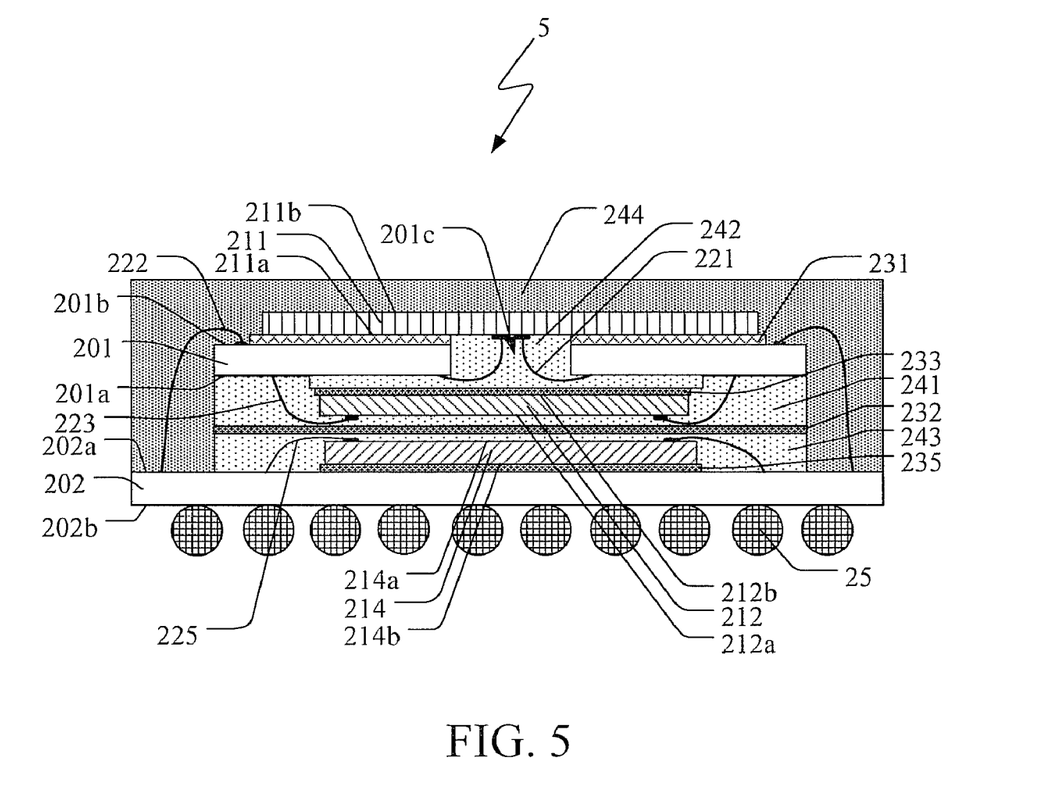
FIG. 5 is a schematic cross-sectional view of the fourth embodiment of the chip package structure according to this invention.

The fourth embodiment of this invention is a chip package structure 5, a schematic cross-sectional view of which is depicted in FIG. 5. The chip package stricture 5 consists of the same elements as those of the chip package structure 3 of the third embodiment, except that the first chip 211, the first adhesive layer 231, the first substrate 201, the second plastic layer 242, the third adhesive layer 233 and the second chip 212 of this embodiment are arranged in reverse order from that of the third embodiment.

The relative positions among the first chip 211, the first adhesive layer 231, the first substrate 201, the second plastic layer 242, the third adhesive layer 233 and the second chip 212 are all similar to those of the second embodiment. Furthermore, in the chip package structure 5 of this embodiment, the first surface 201a (instead of the second surface 201b) of the first substrate 201 is opposite to the third surface 202a of the second substrate 202, and the second surface 201b (instead of the first surface 201a) of the first substrate 201 is electrically connected to the third surface 202a via the second wire portion 222.

Like the third embodiment but unlike the second embodiment, the chip package structure 5 of the fourth embodiment comprises the fourth chip 214, the fifth wire portion 225, the fifth adhesive layer 235 and the third plastic layer 243, but does not comprises the third chip 213, the fourth wire portion 224 and the fourth adhesive layer 234.

In the chip package structure 5 of this embodiment, elements above the second adhesive layer 232 as well as the relative positions thereof are the same as those of the second embodiment, and elements under the third plastic layer 243 as well as the relative positions thereof are the same as those of the third embodiment. Thus, this will not be described again herein. As thus, the structures (exclusive of the wires) in the chip package structure 5 of this embodiment include, from top to bottom, the outer plastic layer 244, the first chip 211, the first adhesive layer 231, the first substrate 201, the second plastic layer 242, the third adhesive layer 233, the second chip 212, the first plastic layer 241, the second adhesive layer 232, the third plastic layer 243, the fourth chip 214, the fifth adhesive layer 235 and the second substrate 202.

The materials of the individual elements in the above embodiments will be detailed as follows. The conductive balls are preferably made of a material comprising tin. Other conductive materials adapted to be connected to the second substrate may also be used in this invention. The first adhesive layer for connecting the first chip to the first substrate is preferably made of a B-stage thermosetting mixture. Other adhesive layers, i.e., the second, the third, the fourth and the fifth adhesive layers, may be made of an adhesive film or an adhesive with epoxy resin.

Figure 6A:
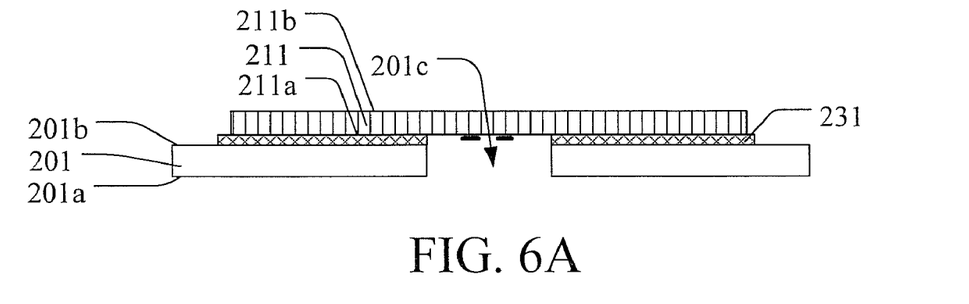
FIGS. 6A to 6H are schematic cross-sectional view partially illustrating a manufacturing process flow of the chip package structure according to this invention.
Figure 6B:
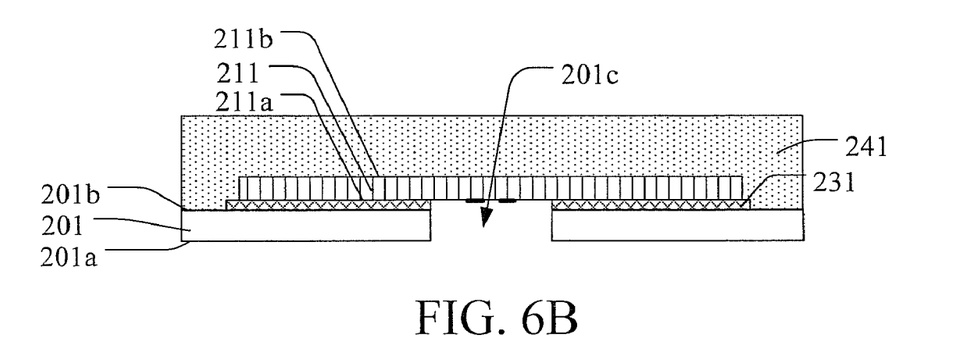
Figure 6C:
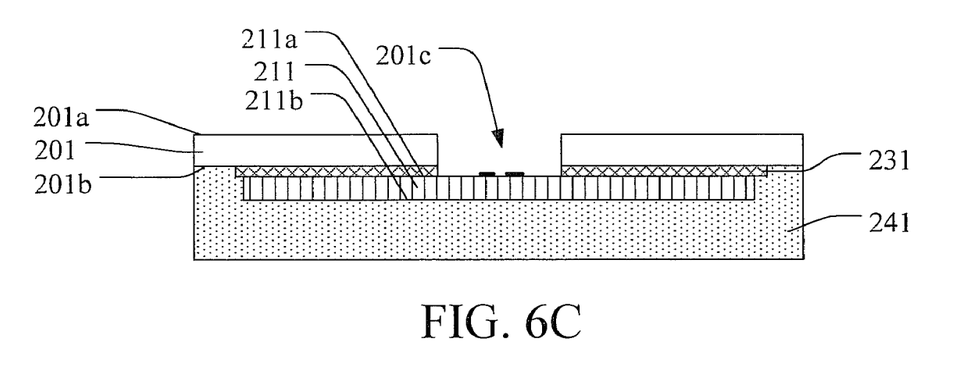

The schematic cross-sectional views illustrate a manufacturing process flow partially using the chip package structure 2 of the first embodiment of this invention as an example. FIGS. 6A to 6H illustrate the flow diagrams of connecting and electrically connecting the first chip 211, the second chip 212, the first substrate 201, the second substrate 202 and a plurality of conductive balls 25 with each other. Initially, as shown in FIG. 6A, the first bonding surface 211a of the first chip 211 is adhered to the second surface 201b of the first substrate 201 via the first adhesive layer 231. The first chip 211 is adapted to cover the via hole 201c of the first substrate 201. Subsequently, as shown in FIG. 6B, the first plastic layer 241 is formed on the second surface 201b and covers the first chip 211. Then, the resulting structure is flipped over with the first surface 201a facing upwards, as shown in FIG. 6C.

Figure 6D:
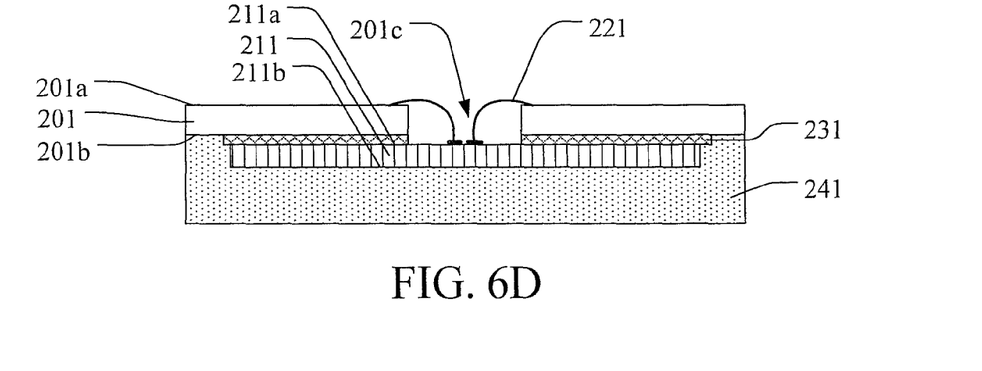
Figure 6E:
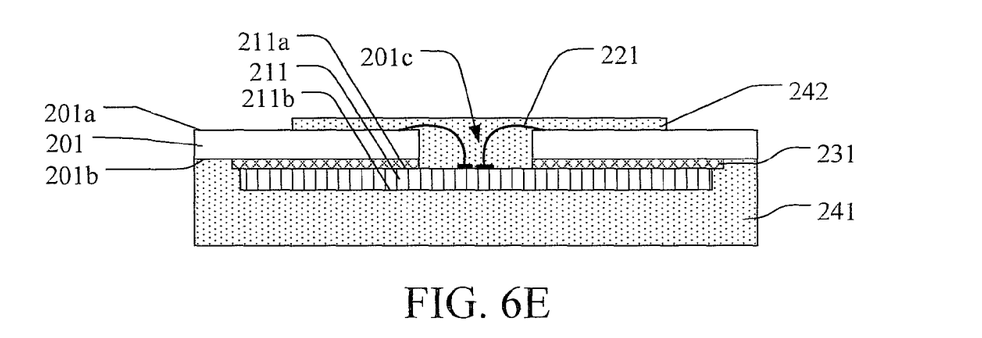
Figure 6F:
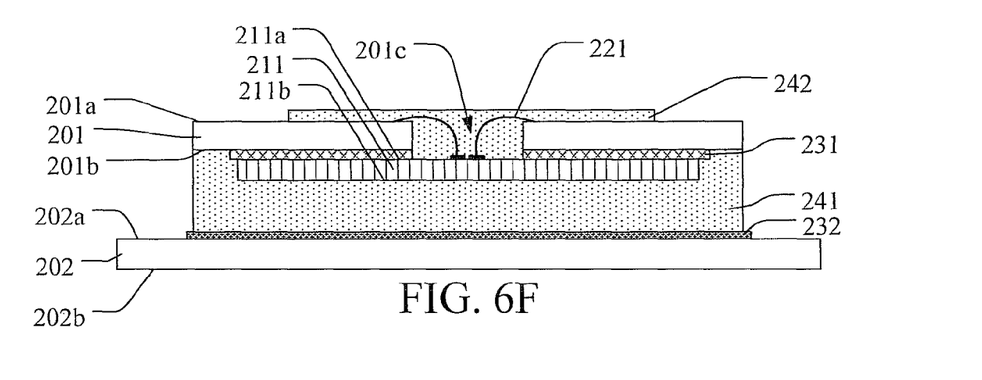
Figure 6G:
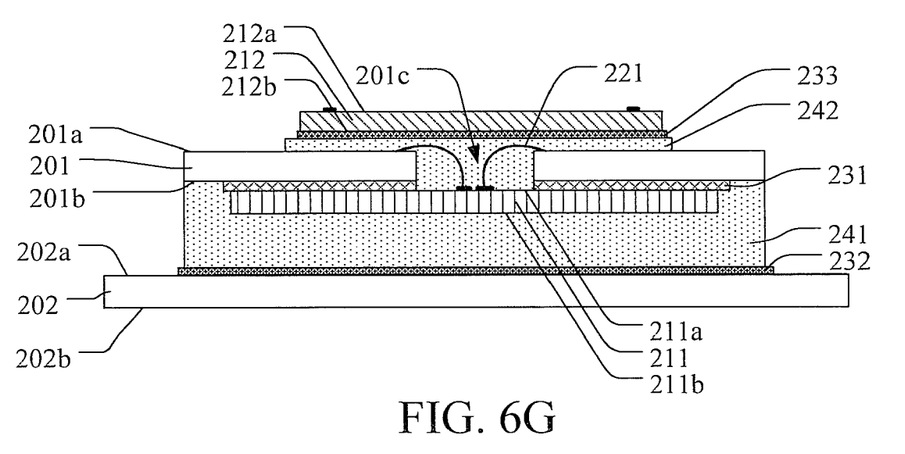
Figure 6H:
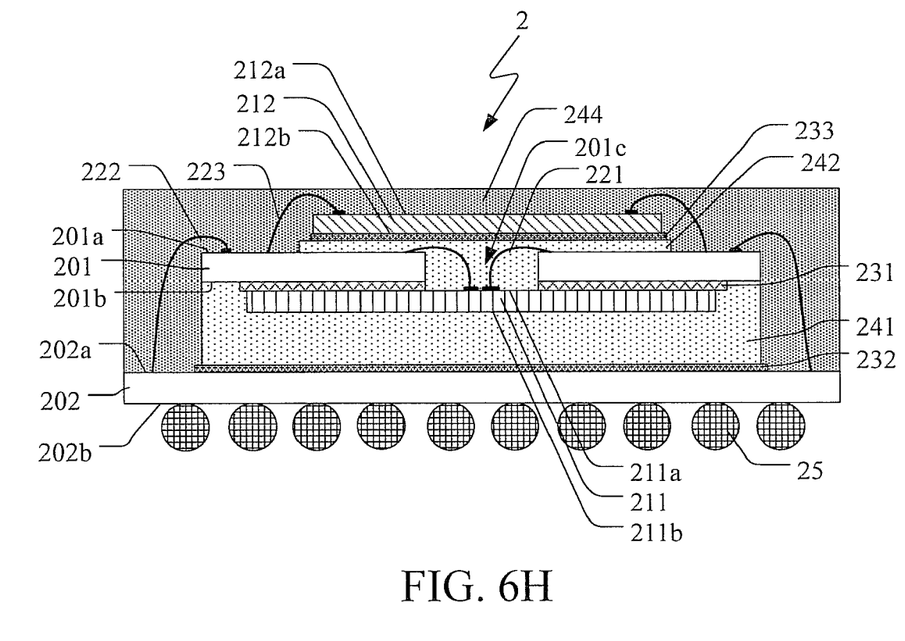

As shown in FIG. 6D, the first wire portion 221 which passes through the via hole 201c is wire bonded to the first bonding surface 211a of the first chip 211 and the first surface 201a of the first substrate 201 to electrically connect the first bonding surface 211a and the first surface 201a. Next, a second plastic layer 242 is partially formed on the first surface 201a of the first substrate 201 and in the through-hole 201c of the first substrate 201, as shown in FIG. 6E. Subsequently, as shown in FIG. 6F, the first plastic layer 241 under the first substrate 201 is adhered to the third surface 202a of the second substrate 202 via the second adhesive layer 232. The second opposite surface 212b of the second chip 212 is adhered to the second plastic layer 242 via the third adhesive layer 233 to connect the second chip 212 and the first substrate 201 together, as shown in FIG. 6G. Finally, the second wire portion 222 is wire bonded to the first surface 201a of the first substrate 201 and the third surface 202a of the second substrate 202 to electrically connect the first substrate 201 and the second substrate 202. The third wire portion 223 is wire bonded to the second bonding surface 212a of the second chip 212 and the first surface 201a of the first substrate 201 to electrically connect the second chip 212 and the first substrate 201. Then, an outer plastic layer 244 is formed to cover the resulting structure, as shown in FIG. 6H. The manufacturing process flows associated with other devices such as the third chip 213 and the fourth chip 214 will readily occur to those skilled in the art.

In the above embodiments, some structures may be assembled and connected through the same process flow. For instance, the first chip 211, the first adhesive layer 231, the first substrate 201, the second plastic layer 242, the third adhesive layer 233 and the second chip 212 of the first to the fourth embodiments may be connected collectively at first, and then positioned in a normal orientation or upside down before being subjected to a subsequent adhering and packaging step to form the chip package structure of the respective embodiments.

The chip package structure of the above embodiments may further have chips unlike the aforesaid ones packaged therein. All the chips from the first to the fourth may be included, or only the first chip and any one of the other chips described above may be included. Such variations and corresponding designs may readily occur to those skilled in the art and therefore, still fall within scope of the claims of this invention.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:
1. A chip package structure, comprising:
a first substrate, having a first surface, a second surface and a via hole;
a second substrate, having a third surface opposite to one of the first surface and the second surface, while the other of the first surface and the second surface is electrically connected to the third surface; and a plurality of chips, at least one of which adhesively connects to the second surface, covers the via hole, and electrically connects to the first surface through the via hole;

wherein the plurality of chips further comprise a second chip, having a second electrical bonding surface and a second opposite surface, where the second opposite surface is adhesively connected to the first surface.

2. The chip package structure as claimed in claim 1, wherein:
the plurality of chips comprise a first chip, comprising a first electrical bonding surface being connected to the second surface and covering the via hole; and
the chip package structure further comprises:
a first wire portion electrically connecting the first chip and the first surface through the via hole, and
a second wire portion electrically connecting the third surface to the one of the first surface and the second surface which is electrically connected to the third surface.

3. The chip package structure as claimed in claim 2, wherein the second substrate further comprises a plurality of conductive balls and a fourth surface, while the plurality of conductive balls are disposed on the fourth surface.

4. The chip package structure as claimed in claim 3, wherein:
the chip package structure further comprises a third wire portion electrically connecting the second electrical bonding surface to the first surface.

5. The chip package structure as claimed in claim 4, further comprising a third adhesive layer adapted to connect the second opposite surface and the first surface.

6. The chip package structure as claimed in claim 5, further comprising a second plastic layer at least disposed between the third adhesive layer and the first substrate, wherein the second plastic layer is adapted to connect the third adhesive layer and the first surface.

7. The chip package structure as claimed in claim 6, wherein the second plastic layer is further disposed in the via hole.

8. The chip package structure as claimed in claim 5, wherein the third adhesive layer is an adhesive film or an adhesive with epoxy resin.

9. The chip package structure as claimed in claim 3, wherein:
the plurality of chips further comprise a third chip, having a third bonding surface and a third opposite surface, while the first chip further has a first opposite surface and the third opposite surface is connected to the first opposite surface; and
the chip package structure further comprises:
a fourth wire portion electrically connecting the third bonding surface to the second surface.

10. The chip package structure as claimed in claim 9, further comprising a fourth adhesive layer adapted to connect the first opposite surface and the third opposite surface.

11. The chip package structure as claimed in claim 10, wherein the fourth adhesive layer is an adhesive film or an adhesive with epoxy resin.

12. The chip package structure as claimed in claim 3, wherein:
the plurality of chips further comprise a fourth chip, having a fourth electrical bonding surface and a fourth opposite surface, while the fourth opposite surface is connected to the third surface; and
the chip package structure further comprises:
a fifth wire portion electrically connecting the fourth electrical bonding surface to the third surface.

13. The chip package structure as claimed in claim 12, further comprising:
a first adhesive layer adapted to connect the first electrical bonding surface and the second surface;
a second adhesive layer adapted to connect the first substrate and the second substrate;
a first plastic layer disposed between the second adhesive layer and the first substrate, wherein the first plastic layer is adapted to connect the second adhesive layer and the one of the first surface and the second surface which is opposite to the third surface; and
a fifth adhesive layer adapted to connect the fourth opposite surface and the third surface.

14. The chip package structure as claimed in claim 13, further comprising a third plastic layer disposed between the second adhesive layer and the second substrate, wherein the third plastic layer is adapted to connect the second adhesive layer and the third surface.

15. The chip package structure as claimed in claim 13, wherein the fifth adhesive layer is an adhesive film or an adhesive with epoxy resin.

16. The chip package structure as claimed in claim 3, wherein each of the conductive balls is made of a material comprising tin.

17. The chip package structure as claimed in claim 2, further comprising a first adhesive layer and a second adhesive layer, wherein the first adhesive layer is adapted to connect the first bonding surface and the second surface, and the second adhesive layer is adapted to connect the first substrate and the second substrate.

18. The chip package structure as claimed in claim 17, further comprising a first plastic layer disposed between the second adhesive layer and the first substrate, wherein the first plastic layer is adapted to connect the second adhesive layer and the one of the first surface and the second surface which is opposite to the third surface.

19. The chip package structure as claimed in claim 17, wherein the first adhesive layer is made of a material, and the material is a B-stage thermosetting mixture.

20. The chip package structure as claimed in claim 17, wherein the second adhesive layer is an adhesive film or an adhesive with epoxy resin.

* * * * *